United States Patent [19]

Hopkins et al.

[11] Patent Number: 5,770,959
[45] Date of Patent: Jun. 23, 1998

[54] CIRCUIT FOR PROVIDING THE POWER-UP STATE OF AN ELECTRICAL DEVICE

[75] Inventors: Thomas L. Hopkins, Mundelein, Ill.; Giorgio Pedrazzini, Milan, Italy

[73] Assignee: SGS-Thomson Microelectronics, Inc., Carrollton, Tex.

[21] Appl. No.: 815,994

[22] Filed: Mar. 10, 1997

Related U.S. Application Data

[63] Continuation of Ser. No. 371,270, Dec. 23, 1994.

[51] Int. Cl.⁶ .................................................. H03L 7/00
[52] U.S. Cl. ........................ 327/143; 327/198; 327/225
[58] Field of Search ................................. 327/142, 143, 327/198; 307/39; 364/483, 492; 323/318, 282–289

[56] References Cited

U.S. PATENT DOCUMENTS

| | | | |
|---|---|---|---|
| 4,208,594 | 6/1980 | Guicheteau | 327/143 |
| 4,234,920 | 11/1980 | Van Ness et al. | 327/143 |
| 4,367,422 | 1/1983 | Leslie | 327/143 |
| 4,574,355 | 3/1986 | Beatty et al. | 364/492 |
| 4,945,300 | 7/1990 | Sato et al. | 327/142 |
| 5,196,731 | 3/1993 | Abe et al. | 307/142 |

*Primary Examiner*—Timothy P. Callahan
*Assistant Examiner*—Kenneth B. Wells
*Attorney, Agent, or Firm*—David V. Carlson; Theodore E. Galanthay; Lisa K. Jorgenson

[57] ABSTRACT

A restart circuit for an electronic device having a first switch, a second switch, an activation device for initiating a restarting operation of the electronic device when at least one of the first switch and the second switch is in a closed position, and a storage device, capable of being read by the electronic device any time after the restarting operation, for storing in digital format the position of the first switch and the second switch during the initiation of the restarting operation.

20 Claims, 2 Drawing Sheets

CIRCUIT FOR PROVIDING THE POWER-UP STATE OF AN ELECTRICAL DEVICE

CROSS-REFERENCE TO RELATED APPLICATION

This application is a continuation of U.S. Pat. application No. 08/371,270, filed Dec. 23, 1994, now abandoned.

TECHNICAL FIELD

The invention relates generally to a restart circuit, and, more particularly, to a restart circuit for an electronic device.

BACKGROUND OF THE INVENTION

Devices requiring electrical power, especially battery powered devices, such as portable computers, portable instrumentation, cameras, calculators, watches, radios, etc., need to conserve energy. Many of these electrically-powered devices conserve energy by entering sleep mode if not used for some time period. This can be accomplished by a program stored in the electronic device. The device may also be shut off by removing the connection to the power supply, thus conserving power.

There are a number of ways the electronic device may be restarted if it is not currently active. For example, the electronic device can be restarted by a change in a logic level input. Alternatively, it can be restarted by pressing a switch or some other cause like a change in the position of a switch. Another way that the electronic device can be activated is by closing a switch in series with the device's power source. In each instance, it is helpful to know the switch positions during the electronic device's restart after it receives the logic level input or when power is reapplied.

FIG. 1 shows a prior art circuit diagram for shutting down and awakening an electronic device 20. The circuit is powered by a battery 22 and has a first switch 24 and a regulator 26 sequentially connected in series. The first switch 24, using known circuitry not shown, will turn on regulator 26 when closed by enabling line 27. This switch 24 is also connected to a first resistor 30 and a first capacitor 32. The circuit has a second switch 34 which is connected to a second resistor 36 and a second capacitor 38.

Three signals can be used during the restarting process of the electronic device 20. The first signal SIG1 is applied to terminal 44 of the electronic device 20. A second signal SIG2 changes state when the second switch 34 is closed and is applied to terminal 46 of the electronic device 20. The third signal SIG3 changes state when the first switch 24 is closed and is applied to terminal 48 of the electronic device 20.

The first signal SIG1 changes state when the regulator is turned on by either the closure of the first switch 24 or by the regulator on/off control line 27. Voltage Vcc from the regulator 26, as well as the third resistor 40, and the third capacitor 42 produce an RC time constant that acts as a logic level input causing the electronic device 20 to restart. The time constant of first resistor 30 and first capacitor 32 creates signal SIG3, which is used to maintain information accessible by the electronic device 20 via terminal 48 about the state of closure of the first switch 24. Further, the time constant of second resistor 36 and second capacitor 38 creates SIG2, which is used to maintain information accessible by the electronic device 20 via terminal 46 about the state of closure of the second switch 34.

A distinct disadvantage of the circuit shown in FIG. 1 is that the first capacitor 32 and the second capacitor 38 must have a large enough capacitance to maintain the information about the state of the respective switch for a period at least as long as the time it takes the electronic device 20 to execute a restarting algorithm. This is because the electronic device 20 can only read the inputs at terminals 46 and 48 after it is functioning. Thus battery operated devices that need to conserve energy and be small and lightweight may require large capacitors to permit proper restart. Further, the electronic device 20 is dependent on the limitations of the external circuitry, such as the RC circuits, as to when it can acquire information about the states of switches during the restarting operation. Storage of the states of switches immediately at the beginning of the resetting operation can be of significant importance since often a switch will have a duration of closure that is less than the time required for the electronic device to fully restart, Thus, the electronic device 20 of the overall powered device is limited by the external circuitry as to when it can access important information.

SUMMARY OF THE INVENTION

An object of the invention is to allow a restarted electronic device to determine its source of activation at any time after being restarted. It is another object of the invention to store the restart state without requiring the use of excessively large capacitors.

According to principles of the invention, a restart circuit is provided for an electronic device. The restart circuit comprises a first switch having an open and closed position, and a second switch having an open and closed position. The circuit also includes necessary components to restart the electronic device when either the first switch or the second switch is closed. The restart circuit may also include a regulator for producing a voltage and for supplying a restarting signal. The regulator produces the restart signal and begins the production of the voltage when at least one of the first switch and the second switch is placed in the closed position. The invention also includes a digital storage circuit capable of being read by the electronic device any time after the initiation of the restarting operation. The digital storage circuit stores digital values that indicate the position of the first switch and the second switch, respectively, during the initiation of the restarting operation. This information is stored and held independent of external constraints on its availability and can be accessed at any time by the electronic device. Thus, the storage device can receive and store the data very quickly and then hold data until it can be sensed at a later point in time and then the data can be cleared. Quick storage features can be beneficial, especially if either the first or second switch is closed for only a short duration.

Other objects and advantages of the present invention will become readily apparent to those skilled in this art from the following detailed description. As will be realized, the invention is capable of use in different environments, and modifications can be node without departing from the invention. Accordingly, the drawings and description are to be regarded as illustrative in nature, and not as restrictive.

DETAILED DESCRIPTION OF THE INVENTION

Figure 1:
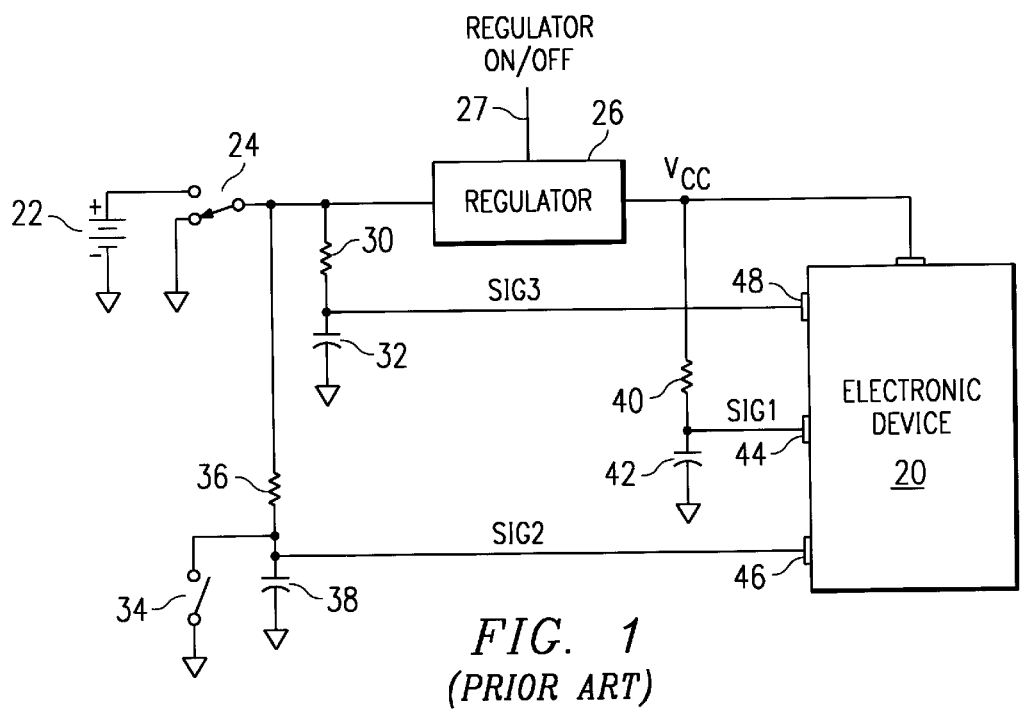
FIG. 1 is a circuit diagram of a prior art restarting circuit.
Figure 2:
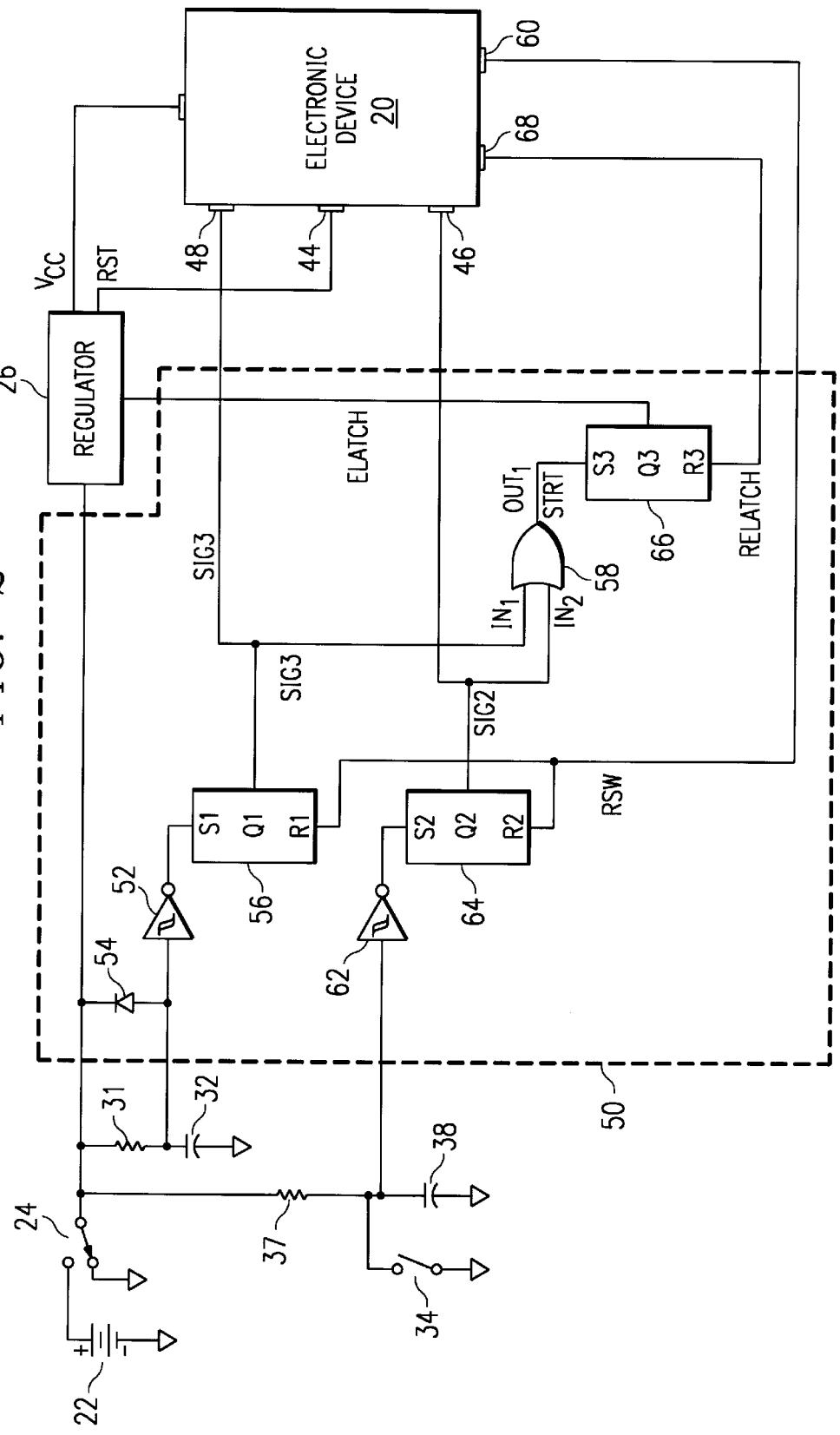
FIG. 2 is a circuit diagram of a first embodiment of the present invention.

FIG. 2 is a circuit diagram of a first embodiment of the present invention. Many of the sane components having the same function as those disclosed in the prior art circuit of FIG. 1 may also be used. For example, the circuit may still include first and second switches 24 and 34, first and second resistors 30, 36 (renumbered as 31, 37 in FIG. 2) and capacitors 32, 38, respectively. A regulator 26 provides power to an electronic device 20, having terminals 44, 46, and 48. This electronic device 20 may be an acceptable electronic circuit, including a group of circuits, application logic or a microprocessor. Small capacitors 32 and 38 may still be used if desired, but such capacitors 32 and 38 need not be present in some embodiments of the invention.

The present invention includes a digital storage circuit 50, such as a CMOS logic circuit, shown within the dashed lines. In a preferred embodiment, the circuit 50 is a low power CMOS circuit having essentially no power drain. Further, the circuit 50 is preferrably external to the electronic device 20 and always connected to a power supply line, such as the line connected to battery 22. The logic circiut 50 receives power when the regulator is off because it is connected directly to the power supply line. This allows the circuit 50 to receive power even when the electronic device 20 is in a sleep mode or the regulator is off. Since the circuit 50 is a low power static CMOS circuit, its drain on the battery 22 is nominal to zero, even though it is connected with switch 24 closed. Of course, if switch 24 is open, none of the circuitry is receiving power because switch 24 is the master power supply connection switch.

The circuit 50 stores values representing the state of the switches 24 and 34 when the circuit is restarted. This can be in the form of digital code or signals held at selected logic levels, as the design may require. Storing the state as digital codes allows access to this information at any tine, regardless of the time it takes for the electronic device to wake up and independent of any external signal of limited duration. Further, it stores a digital value that does not fade or change over time. The value will not change until the memory is cleared or the storage circuit is affirmatively reset. If a CMOS logic circuit is used for storage circuit 50, it will operate in a static condition, so the power consumption is negligible.

In one embodiment, the digital logic circuit 50 comprises a first CMOS inverter 52 coupled to the first capacitor 32 and a first impedance device 31, and it is also coupled to the first switch 24 via a diode 54. The output of the inverter 52 is coupled to a set terminal $S_1$ of a first RS flip flop 56. An output terminal $Q_1$ of the first flip flop 56 is coupled to terminal 48 of electronic device 20 and to a first input terminal $in_1$ of OR gate 58. The first flip flop 56 also has a reset terminal $R_1$, which is connected to terminal 60 of the electronic device 20. A second inverter 62 is coupled to the second impedance device 37, the second capacitor 38 and the second switch 34. The output of the inverter 62 is coupled to a set terminal $S_2$ of a second RS flip flop 64. The output terminal $Q_2$ of the second flip flop 64 is coupled to terminal 46 of electronic device 20 and to a second input terminal $in_2$ of OR gate 58. The reset terminal $R_2$ of the second flip flop 64 is coupled to terminal 60 of electronic device 20. The output terminal $out_1$ of OR gate 58 is coupled to a set terminal $S_3$ of a third flip flop 66. The output terminal $Q_3$ of the third flip flop 66 is coupled to the regulator 26, which in turn is coupled to the electronic device 20. Although the present embodiment comprises two RS flip flops as digital storage devices, many other forms of storage could be used to capture data, such as registers, counters, or buffers. Preferably, these should be quick-acting, low-powered or zero power storage devices. Many of these can be coupled directly to the switches without the need for the resistors or capacitors.

The CMOS inverters 52 and 62, as well as the flip-flops 56, 64, and 66 and "and" gate 58 are coupled to the appropriate power supply during operation of the circuit, but this is not shown because it is conventional. If the switch 24 is open so that no power from the battery is provided to the entire circuit, the battery being the sole source of power for some embodiments, then upon closing switch 24, the power is instantly provided to the circuits 52, 56, 58, 62, and 66, causing them to begin operation in the desired state.

The circuit in FIG. 2 operates as follows. If restarting of the electronic device 20 is initiated by closing switch 24, immediately upon the first switch 24 being closed, the output signal SIG3 of the first flip flop 56 from terminal $Q_1$ goes high. The output $Q_1$ will remain high, being stored as a digital 1, until the flip-flop 56 is reset; it will not change state again even if the input value at $S_1$ changes state, the flip-flop 56 not being a clocked flip-flop. The high output of SIG3 is provided to the OR gate 58, which causes the $Q_3$ output to become high, placing ELATCH in a high state. ELATCH in a high state enables the regulator 26 to output the restart signal RST and to provide Vcc to the electronic device 20. Power from the battery 22 is thus applied to the CMOS circuit 50, and the electronic device 20, at some later time, can sense that $Q_1$ at input 44 is high and use this information as may be desired. After this information is used, the electronic device 20 will output signal RSW to reset the flip-flop 56 causing the output to go low. If, on the other hand, restart is initiated by closing switch 34, the output signal SIG2 of the second flip flop 64 from terminal $Q_2$ goes high.

If the switch 24 was already closed when switch 34 was closed, flip-flop 56 will have been reset some time prior by the electronic device 20 and the output $Q_1$ will be at a zero, or low logic level. The output of $Q_1$ low and $Q_2$ high provides a two-bit digital code that indicates the circuit was restarted by the closing of switch 34, while switch 24 had been closed for some prior time. This information is provided as an input to the electronic device 20, for use as may be desired. After this information is no longer needed, the electronic device 20 will output a signal on RSW to reset flip-flop 56.

The output signals SIG3 and SIG2 from terminal $Q_1$ and $Q_2$, respectively, will remain in their initial state until they are reset by a reset signal RSW from the electronic device 20 at terminal 60 under control of software so that subsequent inputs can activate the circuit. This usually happens some time prior to the device entering the sleep mode.

When either the output signal SIG3 from terminal $Q_1$, or SIG2 from terminal $Q_2$ goes high, this will cause the output signal STRT from terminal $out_1$ of the OR gate 58 to go high, which in turn causes the output signal ELATCH of the third flip flop 66 from terminal $Q_3$ to go high. When the regulator 26 determines that the ELATCH from terminal $Q_3$ is high, it will generate a voltage for the electronic device 20, including a restart signal RST and voltage Vcc to be applied to the electronic device 20. This in turn will initiate the restart or "wake-up" operation in the electronic device 20.

Since the Output signal STRT from OR gate 58 and the output signal ELATCH from the third flip flop 66 will go high if either the signal SIG3 from the first flip flop 56 or the signal SIG2 from the second flip flop 64 goes high, the regulator 26 will wake up the electronic device 20 and cause it to restart when either the first switch 24 is closed, or the second switch 34 is closed. In this example, the first switch 24 is coupled to the power supply, so it must be in the closed position for switch 34 to be effective. This will not be the case for all embodiments because for some circuits, power may be supplied through yet a third switch and switches 24 and 34 will both cause a restart independent of each other and still provide the two-bit digital data to the electronic device 20.

The state of the output signal SIG3 from the first flip flop terminal $Q_1$ and the state of the output signal SIG2 of the second flip flop at terminal $Q_2$ can be read by the electronic device 20 at terminals 44 and 46, respectively, at any time after restart. Thus, the electronic device 20 is free to sense the state of the first switch 24 or the second switch 34 during restart whenever it wishes to, and the electronic device 20 can maintain this information as long as it determines it is practical. After that, the electronic device 20 sends a reset switch signal RSW to clear the data. This prepares the storage devices to accept new data if the electronic device receives a restart signal. Thus the indication of which switches were closed just prior to the resetting of electronic device 20 remains accessible for as long as the device 20 determines it is practical or desirable.

By this arrangement, it is possible for the electronic device 20 to determine if the cause of its "awake up" was the closure of switch 24 or the closure of switch 34. Further, the time constant required for the RC circuit comprising first impedance device 31 and capacitor 32 and the time constant required for the RC circuit comprising second impedance device 37 and capacitor 38 no longer have to last the entire time it takes the electronic device 20 to restart. Instead, these time constants must only last long enough to set the flip flops 56 and 64. This can occur in a very short time. Since the electronic device 20 can execute its restart routine without being concerned if the time constant of the first and second RC circuits 31, 32 and 37, 38 are long enough to maintain input information, the present embodiment does not require an excessively large capacitance, as required in the prior art. This allows the device utilizing the energy saving circuit to be smaller and lighter in weight. Of course, by the selection of the correct components, the circuit 50 can be assured of storing the correct state of the switches 24 and 34 very quickly, almost instantaneously, so that the RC time constant of 31, 32, 37 and 38 can be quite short and the proper data is stored in a suitable device, such as a flip flop or other acceptable storage device.

After some predetermined period of non-use, as may be determined by lack of an external signal for some time period, the opening of a compartment, or the removal of a battery, the electronic device 20 can shut down by any acceptable method, i.e., go into sleep mode, by sending a signal RELATCH from terminal 68 to reset terminal $R_3$ of the third flip flop 66, which causes the signal ELATCH to go low and shut off regulator 26. At some prior time, the electronic device 20 has reset the first and second flip flops 56, 64 so that signals SIG3 and SIG2 are low, by having sent a reset switch signal RSW from terminal 60, as described above.

Figure 3:
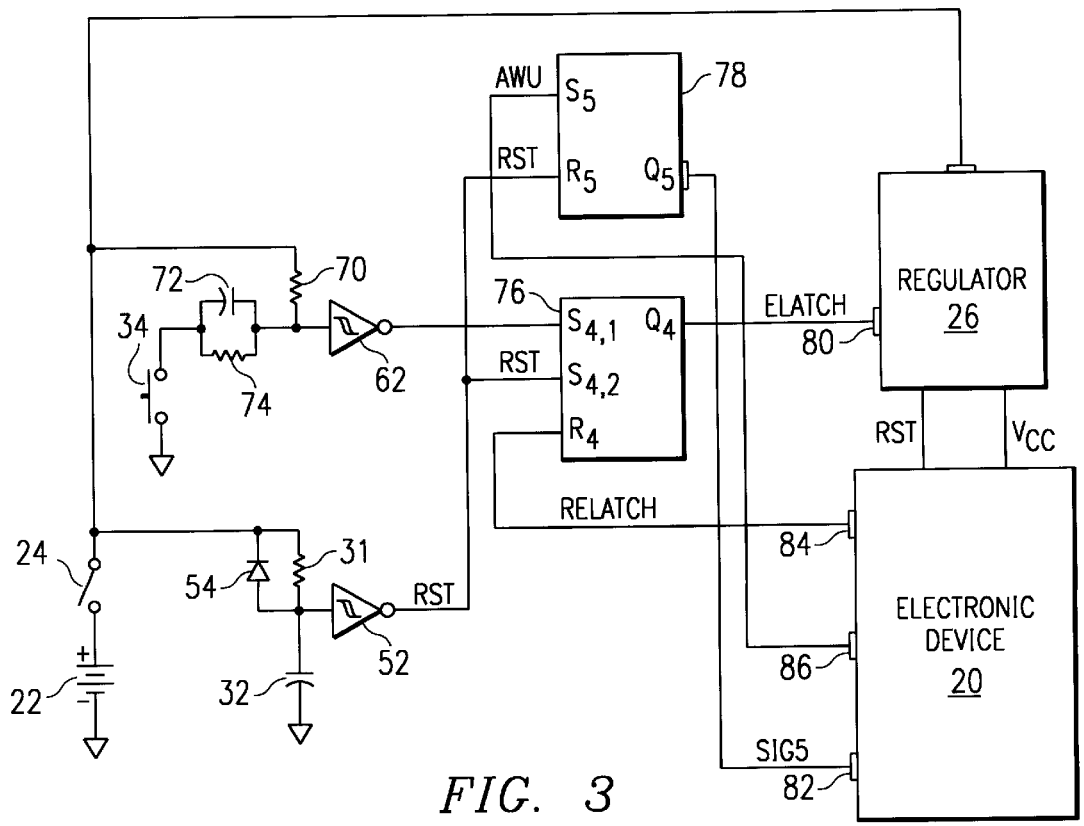
FIG. 3 is a circuit diagram of a second embodiment of the present invention.

FIG. 3 is a circuit diagram of a second embodiment of the present invention. This circuit is similar to the previous embodiment in that it has the first switch 24, the second switch 34, the battery 22, the regulator 26, and electronic device 20. As in the first embodiment, the first switch 24 is coupled to the diode 54, the first impedance device 31, the first capacitor 32, and the inverter 52. However, in this embodiment, the first switch is also coupled to second inverter 62, as is second switch 34. The first switch 24 is coupled to the second inverter 62 via an impedance device 70, while the second switch 34 is coupled to the second inverter 62 via a capacitor 72 and an impedance device 74, which has a greater impedance than the impedance device 70. In an alternative embodiment, a diode may be connected across the impedance device 70 to facilitate the discharge of capacitor 72. The output terminal of the second inverter 62 is coupled to a first set terminal $S_{4,1}$, of an activation flip flop 76. The activation flip flop 76 also has a second set terminal $S_{4,2}$, which is connected to the output of the first inverter 52, an output terminal $Q_4$, which is coupled to the regulator 26 at terminal 80, and a reset terminal $R_4$, which is coupled to the electronic device 20 at terminal 84. The regulator 26 provides to the electronic device 20, via electrical connection, a restart signal RST and voltage Vcc. The output terminal of the first inverter 52 is also coupled to a reset terminal $R_5$ of an indication flip flop 78. An output terminal $Q_5$ is coupled to the electronic device 20 at terminal 82. The set terminal $S_5$ is also coupled to the electronic device 20.

When the first switch 24 is closed, a high ELATCH signal is output from the output terminal $Q_4$ of the activation flip flop 76, the signal causes the regulator 26 to restart the electronic device 20 and provide it with a voltage Vcc, thereby waking it up. The closure of the first switch 24 will also reset the indication flip flop 78 causing output signal SIG5 from the output terminal $Q_5$ of the indication flip flop 78 to go low, indicating to the electronic device 20 that the first switch 24 was previously in the open position but has now been moved to a closed position. This data state remains stored on the flip-flop 78 until it is not needed, at which time signal AWU goes high to cause $Q_5$ to go high. At some time later, the circuit may enter sleep mode and be awakened this time by switch 34, with switch 24 remaining closed at all lines. Now, when second switch 34 is closed, this will also cause the signal ELATCH from terminal $Q_4$ of the activation flip flop 76 to go high and direct the regulator 26 to reset the electronic device 20. The output $Q_5$ is high and this is provided as a data input at 82 of the electronic device.

When the electronic device 20 has used the data to determine the position of switches 24 and 34 at restart via signal SIG5 from the indication flip flop 78, it will send a signal AWU from its terminal 86 to set terminal S5 of indication flip flop 78 to make the signal SIG5 high. If the electronic device 20 wishes to shut itself down, then it can send the RELATCH signal to the reset terminal $R_4$ of activation flip flop 76 to cause the ELATCH signal from terminal Q4 to go low and shut down the voltage from the regulator 26 to the electronic device 20.

Although the above embodiments provide storage for the states of just two switches, the present invention can be used to store the states of any number of switches to be retrieved by the electronic device 20 by providing other indication devices, such as RS flip flops, within the storage device. This is a single bit indication of which of two switches caused the electronic device to be restarted. Of course, the two-bit code of the first embodiment would easily permit a determination of which one or four switches causes restart and the circuit could easily be configured to accommodate more switches based on the teachings herein. In other embodiments, additional flip-flops or other suitable storage devices could be added to sense and store a number of restart modes, including 3, 4, 5, 6, or more such modes.

Elements 31 and 37 have been described as impedance devices, and they can be any suitable impedance device including a resistor, an MOS transistor, a diode connected MOS transistor, or a diode. Alternatively, the elements 31, 37, and 70 could be a current source or some other element that prevents a change to the input to the inverter a for selected time after the switch is closed. The inverters 52, 62 are preferably in the form of Schmitt inverters, Schmitt triggers or the like to ensure that the output reaches a high state very quickly for an input of zero. The output trip voltages can be set by design of the Schmitt inverter elements as desired for each circuit to trip at the proper voltage levels based on the capacitor sizes, RC time constant, circuit requirements and the like. The design of Schmitt inverters is known in the art and need not be discussed here.

Preferably, some isolation circuitry such as a level shifter, buffer, or other isolation device is positioned between the storage circuitry 50 and the electronic device 20. The use of an isolation circuit between digital CMOS logic and various inputs to an electronic device is well known in the art and any isolation device of those currently available and well known to those in the art today is acceptable to provide this isolation. As is recognized by those of skill in the art, it is desirable to ensure that regardless of the operating condition of the electronic device 20 that it is never able to load down the outputs of the RS flip flops as it goes through various of its own operating routines. Any acceptable isolation circuitry, such as a level shifter, use of an open collector at the output of the RS flip flops, an isolation buffer or others well known in the art are acceptable, many such circuits and their use between power reset circuits and electronic devices powered thereby being well known in the art today and not forming a part of this invention.

In conclusion, the above-described embodiments allow information required by an electronic device such as a microprocessor to be accessed at its convenience and not determined by the values and time constants of external circuitry. Thus, any electronic device such as application logic or a microprocessor, which uses a fixed means of indication, is able to obtain data regarding how it was restarted when it chooses to, instead of being confined to a set time period that is determined by external parameters.

Except as otherwise disclosed herein, the various components shown in outline or block form are individually well-known and their internal construction and their operation is not critical either to the making or the using of this invention or to a description of the best mode of the invention.

While the detailed description above has been expressed in terms of specific examples, those skilled in the art will appreciate that many other configurations could be used to accomplish the purpose of the disclosed inventive apparatus. Accordingly, it will be appreciated that various modifications of the above-described embodiments may be made without departing from the spirit and scope of the invention. Therefore, the invention is to be limited only by the following claims.

We claim:

1. A circuit, comprising:
   an electronic device;
   a power and storage circuit for providing power to and for storing an initial power-up condition of said electronic circuit, said power and storage circuit including:
   a first switch having an open position and a closed position;
   a second switch having said open position and said closed position;
   a regulator coupled to said electronic device and to said first and second switches, said regulator operable to supply power to said electronic device when at least one of said first and second switches is moved from said open position to said closed position; and
   logic circuitry coupled to said first and second switches, to said regulator, and to said electronic device, said logic circuitry operable to store one or more selected values that identify the positions of said first and second switches after said at least one of said first and second switches is moved to said closed position, said logic circuitry including a first flip-flop that is operable to store a first one of said one or more selected values, said first flip-flop having first and second set terminals and a reset terminal, said first and second switches being respectively coupled to said first and second set terminals, and a reset signal from said electronic device being coupled to said reset terminal; and
   said electronic device operable to read said one or more selected values stored in said logic circuitry.

2. The circuit of claim 1 wherein said electronic device is operable to shut down said regulator.

3. The circuit of claim 1 wherein said logic circuitry further comprises a second flip-flop having a set terminal coupled to said electronic device, a reset terminal coupled to one of said first and second switches, and an output terminal coupled to said electronic device.

4. A circuit, comprising:
   an electronic device;
   a power and storage circuit for providing power to and for storing an initial power-up condition of said electronic device, said power and storage circuit including:
   a first switch having an open position and a closed position;
   a second switch having said open position and said closed position;
   a regulator coupled to said electronic device and to said first and second switches, said regulator operable to supply power to said electronic device when at least one of said first and second switches is moved from said open position to said closed position; and
   logic circuitry coupled to said first and second switches, to said regulator, and to said electronic device, said logic circuitry operable to store one or more selected values that identify the positions of said first and second switches after said at least one of said first and second switches is moved to said closed position, said logic circuitry including a first flip-flop having a set terminal coupled to at least one of said first and second switches, said flip-flop operable to store a first one of said one or more selected values, a second flip-flop having a set terminal coupled to a second one of said first and second switches and having an output terminal coupled to said electronic device, said second flip-flop operable to store a second one of said one or more selected values, and a third flip-flop having a set terminal coupled to at least one of said first and second flip-flops and having an output terminal coupled to said regulator; and
   said electronic device operable to read said one or more selected values stored in said logic circuitry.

5. The circuit of claim 4 wherein said electronic device is operable to turn off said regulator after said electronic device reads said one or more selected values stored in said logic circuitry.

6. An electronic circuit for powering an electronic device and storing a power-up condition of the electronic device, the circuit comprising:
   first and second power-supply terminals;
   a first flip-flop having a set terminal and a reset terminal, and having an output terminal coupled to the electronic device;

a first switch having an open position and a closed position, said first switch coupled to said first power-supply terminal and to said set terminal of said first flip-flop;

a second flip-flop having a set terminal and a reset terminal, and having an output terminal coupled to the electronic device;

a second switch having an open position and a closed position, said second switch coupled to said second power-supply terminal and to said set terminal of said second flip-flop;

a third flip-flop having a set terminal coupled to said output terminals of said first and second flip-flops, and having a reset terminal and an output terminal; and a regulator having a power input terminal coupled to said first switch, a sleep-mode input terminal coupled to said output terminal of said third flip-flop, and a power output terminal coupled to said electronic device.

7. The electronic circuit according to claim 6 wherein said reset terminal of said third flip-flop is coupled to said electronic device.

8. The electronic circuit according to claim 6, further comprising:

a first resistor coupled between said first switch and said set terminal of said first flip-flop;

a first capacitor coupled between said first resistor and said second power-supply terminal, said first resistor and first capacitor together having a first time constant associated therewith;

a second resistor coupled between first switch and said set terminal of said second flip-flop;

a second capacitor coupled between said second resistor and said second power-supply terminal, said second resistor and second capacitor having a second time constant associated therewith; and wherein said first and second time constants are each significantly less than a time required for the electronic device to become fully operational after said regulator begins to supply power to the electronic device.

9. The electronic circuit according to claim 6, further comprising:

said reset terminals of said first, second, and third flip-flops being coupled to the electronic device;

wherein said first and second flip-flops are operable to respectively store the positions that said first and second switches had substantially immediately after one of said switches closed to initially activate said regulator, said stored positions of said switches corresponding to said power-up condition of the electronic device;

wherein the electronic device can reset said first and second flip-flops after reading therefrom said stored positions of said first and second switches; and wherein the electronic device can reset said third flip-flop to deactivate said regulator, which then provides reduced or no power to the electronic device.

10. A circuit, comprising:

an integrated circuit; and a power and storage circuit for providing power to and for storing an initial power-up condition of said integrated circuit, said power and storage circuit including:

a first switch having a first position and a second position;

a second switch having said first position and said second position;

a regulator coupled to said integrated circuit and to said first and second switches, said regulator operable to provide power to said integrated circuit when at least one of said first and second switches is moved from said first position to said second position;

logic circuitry coupled to said first and second switches, to said regulator, and to said integrated circuit, said logic circuitry operable to store one or more selected values that identify the positions of said first and second switches after said at least one of said first and second switches is moved to said second position, said logic circuitry including a first flip-flop that is operable to store a first one of said one or more selected values, said first flip-flop having first, second, and third input terminals, said first and second switches being respectively coupled to said first and second input terminals, said third input terminal coupled to receive a reset signal from said integrated circuit; and said integrated circuit operable to read said one or more selected values stored in said logic circuitry.

11. The circuit of claim 10 wherein said electronic device is operable to execute a software routine based on said one or more selected values that are stored in said logic circuitry.

12. The circuit of claim 10 wherein said first position comprises an open-switch configuration and said second position comprises a closed-switch configuration.

13. A circuit, comprising:

an integrated circuit;

a power and storage circuit for supplying power to and for storing an initial power-up condition of said integrated circuit, said power and storage circuit including:

a first switch having a first position and a second position;

a second switch having said first position and said second position;

a voltage regulator coupled to said integrated circuit and to said first and second switches, said regulator operable to provide power to said integrated circuit when at least one of said first and second switches is moved from said first position to said second position; and logic circuitry coupled to said first and second switches, to said regulator, and to said integrated circuit, said logic circuitry operable to store one or more selected values that identify the positions of said first and second switches after said at least one of said first and second switches is moved to said second position, said logic circuitry including a first flip-flop having an input terminal coupled to at least one of said first and second switches, said flip-flop operable to store a first one of said one or more selected values, a second flip-flop having an input terminal coupled to a second one of said first and second switches and having an output terminal coupled to said integrated circuit, said second flip-flop operable to store a second one of said one or more selected values, and a third flip-flop having an input terminal coupled to at least one of said first and second flip-flops and having an output terminal coupled to said regulator; and said integrated circuit operable to read said one or more selected values stored in said logic circuitry.

14. The circuit of claim 13 wherein said integrated circuit is operable to stop said regulator from supplying power to said integrated circuit.

15. An electronic circuit, comprising:

an electronic device that includes an input terminal and a first output terminal;

a power terminal;

a first bistable circuit having first and second input terminals and an output terminal;

a second bistable circuit having a first input terminal coupled to said first ouput terminal of said electronic device, a second input terminal, and an output terminal coupled to said input terminal of said electronic device;

a first switch having first and second positions, said switch coupled to said power terminal and to said first input terminal of said first bistable circuit;

a second switch having said first and second positions, said second switch coupled to said power terminal, to said second input terminal of said first bistable circuit, and to said second input terminal of said second bistable circuit; and a regulator having a power input terminal coupled to said power terminal, a power output terminal coupled to said electronic device, and an on/off terminal coupled to said output terminal of said first bistable circuit.

16. The electronic circuit of claim 15 wherein:

said electronic device comprises a second output terminal; and said first bistable circuit comprises a third input terminal that is coupled to said second output terminal of said electronic device.

17. The electronic circuit of claim 15, further comprising:

a first Schmitt inverter coupled between said first switch and said first input terminal of said first bistable circuit; and a second Schmitt inverter coupled between said second switch and said second input terminal of said first bistable circuit and said second input terminal of said second bistable circuit.

18. A method, comprising:

toggling a first switch from a first to a second position;

storing a first value in a first register in response to said toggling;

storing a second value in a second register in response to said storing a first value;

providing power to an electronic device in response to said storing a second value;

reading said first value with said electronic device after said providing;

storing a third value in said first register after said reading;

uncoupling power from said electronic device after said storing a third value;

toggling a second switch from a third position to a fourth position;

storing a fourth value in a third register in response to said toggling a second switch;

storing said second value in said second register in response to said storing a fourth value;

providing power to said electronic device in response to said storing said second value;

reading said fourth value with said electronic device after said providing power to said electronic device; and storing a fifth value in said third register after said reading said fourth value.

19. The method of claim 18 wherein said uncoupling comprises:

storing a sixth value in said second register; and uncoupling power from said electronic device in response to said storing a sixth value.

20. A method, comprising:

togging a first switch from a first to a second position;

storing a first value in a first register via a first register input terminal in response to said toggling;

storing a second value in a second register in response to said togging;

providing power to an electronic device in response to said storing a first value;

reading said second value with said electronic device after said providing;

storing a third value in said second register after said reading;

storing a fourth value in said first register via a second register input terminal;

uncoupling power from said electronic device in response to said storing a fourth value;

toggling a second switch from a third to a fourth position;

storing said first value in said first register via a third register input terminal in response to said toggling a second switch;

providing power to said electronic device in response to said storing said first value; and reading said third value from said second register with said electronic device after said providing power to said electronic device.

* * * * *